(12) United States Patent
Chen et al.

(10) Patent No.: US 9,589,938 B2
(45) Date of Patent: *Mar. 7, 2017

(54) SEMICONDUCTOR DEVICE INCLUDING AN EMBEDDED SURFACE MOUNT DEVICE AND METHOD OF FORMING THE SAME

(71) Applicant: Taiwan Semiconductor Manufacturing Company, Ltd., Hsin-Chu (TW)

(72) Inventors: Hsien-Wei Chen, Hsin-Chu (TW); Ying-Ju Chen, Tuku Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/981,171

(22) Filed: Dec. 28, 2015

(65) Prior Publication Data

US 2016/0133606 A1   May 12, 2016

Related U.S. Application Data

(63) Continuation of application No. 14/180,138, filed on Feb. 13, 2014, now Pat. No. 9,224,709.

(51) Int. Cl.
*H01L 23/00* (2006.01)
*H01L 23/48* (2006.01)
(Continued)

(52) U.S. Cl.
CPC ........ *H01L 25/0657* (2013.01); *H01L 21/565* (2013.01); *H01L 23/12* (2013.01); *H01L 23/13* (2013.01); *H01L 23/3107* (2013.01); *H01L 23/3114* (2013.01); *H01L 23/49811* (2013.01); *H01L 23/538* (2013.01); *H01L 23/5384* (2013.01); *H01L 23/5386* (2013.01); *H01L 23/5389* (2013.01); *H01L 23/562* (2013.01); *H01L 24/05* (2013.01); *H01L 24/17* (2013.01);
(Continued)

(58) Field of Classification Search
CPC ....... H01L 2224/81; H01L 2224/48145; H01L 2224/0401; H01L 2924/30105; H01L 2224/16145; H01L 2924/15311; H01L 2224/97; H01L 2924/19105; H01L 2924/181; H01L 2924/19043; H01L 2224/16; H01L 2224/48227; H01L 2225/06513; H01L 2924/00; H01L 2224/13111; H01L 2924/0002; H01L 2225/1058; H01L 2224/13; H01L 2924/18161; H01L 2224/4824; H01L 2224/49175

See application file for complete search history.

(56) References Cited

U.S. PATENT DOCUMENTS 9,224,709 B2 * 12/2015 Chen .................. H01L 24/27

* cited by examiner

*Primary Examiner* — Jasmine Clark
(74) *Attorney, Agent, or Firm* — Slater Matsil, LLP

(57) ABSTRACT

Embodiments of the present disclosure include devices and methods of forming the same. An embodiment is a device including a solder resist coating over a first side of a substrate, an active surface of a die bonded to the first side of the substrate by a first connector, and a surface mount device mounted to the die by a second set of connectors, the surface mount device being between the die and the first side of the substrate, the surface mount device being spaced from the solder resist coating.

20 Claims, 4 Drawing Sheets

(51) Int. Cl.
*H01L 25/065* (2006.01)
*H01L 23/31* (2006.01)
*H01L 23/538* (2006.01)
*H01L 23/12* (2006.01)
*H01L 25/10* (2006.01)
*H01L 25/00* (2006.01)
*H01L 23/13* (2006.01)
*H01L 23/498* (2006.01)
*H01L 21/56* (2006.01)
*H01L 23/50* (2006.01)

(52) U.S. Cl.
CPC ............ *H01L 24/19* (2013.01); *H01L 24/27* (2013.01); *H01L 24/32* (2013.01); *H01L 24/81* (2013.01); *H01L 24/83* (2013.01); *H01L 24/97* (2013.01); *H01L 25/105* (2013.01); *H01L 25/50* (2013.01); *H01L 23/3128* (2013.01); *H01L 23/50* (2013.01); *H01L 24/11* (2013.01); *H01L 24/13* (2013.01); *H01L 24/16* (2013.01); *H01L 24/48* (2013.01); *H01L 24/73* (2013.01); *H01L 24/92* (2013.01); *H01L 2224/0401* (2013.01); *H01L 2224/04105* (2013.01); *H01L 2224/1132* (2013.01); *H01L 2224/1145* (2013.01); *H01L 2224/11334* (2013.01); *H01L 2224/11462* (2013.01); *H01L 2224/11849* (2013.01); *H01L 2224/12105* (2013.01); *H01L 2224/13082* (2013.01); *H01L 2224/13109* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16225* (2013.01); *H01L 2224/1703* (2013.01); *H01L 2224/17181* (2013.01); *H01L 2224/2518* (2013.01); *H01L 2224/27015* (2013.01); *H01L 2224/32145* (2013.01); *H01L 2224/32225* (2013.01); *H01L 2224/32258* (2013.01); *H01L 2224/32502* (2013.01); *H01L 2224/45144* (2013.01); *H01L 2224/45147* (2013.01); *H01L 2224/48091* (2013.01); *H01L 2224/48227* (2013.01); *H01L 2224/73204* (2013.01); *H01L 2224/73259* (2013.01); *H01L 2224/73265* (2013.01); *H01L 2224/81815* (2013.01); *H01L 2224/92125* (2013.01); *H01L 2224/97* (2013.01); *H01L 2225/0651* (2013.01); *H01L 2225/06513* (2013.01); *H01L 2225/06568* (2013.01); *H01L 2225/06572* (2013.01); *H01L 2225/06586* (2013.01); *H01L 2225/1035* (2013.01); *H01L 2225/1058* (2013.01); *H01L 2924/1205* (2013.01); *H01L 2924/1206* (2013.01); *H01L 2924/1207* (2013.01); *H01L 2924/12042* (2013.01); *H01L 2924/1431* (2013.01); *H01L 2924/1432* (2013.01); *H01L 2924/1434* (2013.01); *H01L 2924/15153* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19104* (2013.01); *H01L 2924/351* (2013.01)

SEMICONDUCTOR DEVICE INCLUDING AN EMBEDDED SURFACE MOUNT DEVICE AND METHOD OF FORMING THE SAME

PRIORITY

This application is a continuation of U.S. patent application Ser. No. 14/180,138, entitled "Semiconductor Device Including an Embedded Surface Mount Device and Method of Forming the Same," filed on Feb. 13, 2014, now U.S. Pat. No. 9,224,709, issued Dec. 29, 2015, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
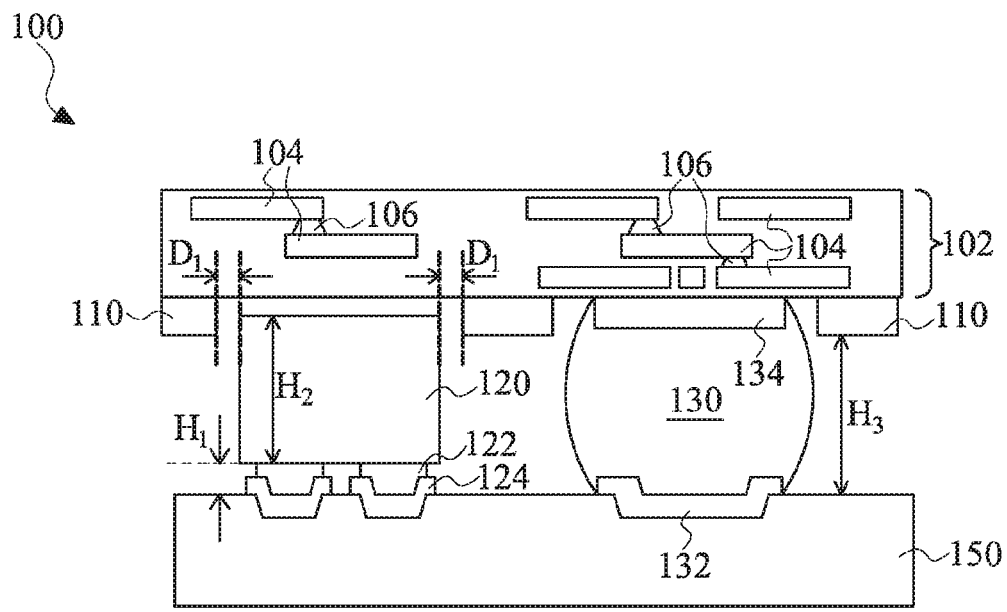
FIGS. 1A and 1B illustrate a cross-sectional view and a plan view, respectively, of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely making and using semiconductor devices including surface mount devices. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

Figure 1B:
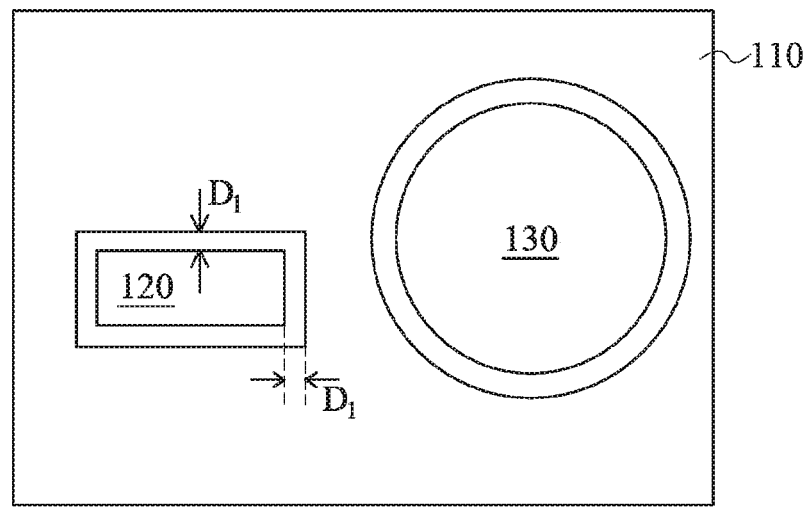

FIGS. 1A and 1B illustrate a cross-sectional view and a plan view, respectively, of a semiconductor device 100 in accordance with some embodiments. FIG. 1A illustrates a semiconductor device 100 including a substrate 102 with metallization layers 104 and vias 106, a solder resist coating 110, a semiconductor die 150, a conductive connector 130 coupling the substrate 102 and the semiconductor die 150, and a surface mount device 120 coupled to the semiconductor die 150 between the semiconductor die 150 and the substrate 102. As illustrated in FIG. 1A, a portion of the solder resist coating 110 over the semiconductor die 150 is removed to provide sufficient space for the surface mount device 120 between the semiconductor die 150 and the substrate 102.

The substrate 102 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 102 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 102 is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for substrate 102.

The substrate 102 may include active and passive devices (not shown in FIG. 1A). As one of ordinary skill in the art will recognize, a wide variety of devices such as transistors, capacitors, resistors, combinations of these, and the like may be used to generate the structural and functional requirements of the design for the semiconductor device 100. The devices may be formed using any suitable methods The substrate 102 may also include metallization layers 104. The metallization layers 104 may be formed over the active and passive devices and are designed to connect the various devices to form functional circuitry. The metallization layers 104 may be formed of alternating layers of dielectric (e.g., low-k dielectric material) and conductive material (e.g., copper) with vias 106 interconnecting the layers of conductive material and may be formed through any suitable process (such as deposition, damascene, dual damascene, or the like).

The substrate 102 includes at least one bond pad 134. The bond pad 134 may be formed in a first side of the substrate 102. In some embodiments, the bond pad 134 is formed by forming recesses (not shown) into the substrate 102 or a passivation layer (not shown) on the substrate 102. The recesses may be formed to allow the bond pad 134 to be embedded into the substrate 102 or the passivation layer. In other embodiments, the recesses are omitted as the bond pad 134 may be formed on a first side of the substrate 102. This bond pad 134 electrically couples the subsequently bonded semiconductor die 150 to the metallization layers 104, the active and passive devices (not shown) of substrate 102, and/or the connectors (not shown) on a second side of the substrate 102. In some embodiments, the bond pad 134 includes a thin seed layer (not shown) deposited on the substrate 102, such as by physical vapor deposition (PVD), chemical vapor deposition (CVD), atomic layer deposition (ALD), the like, or a combination thereof. The seed layer may be made of copper, titanium, nickel, gold, the like, or a combination thereof. The conductive material of the bond pad 134 may be deposited over the thin seed layer. The conductive material may be formed by an electro-chemical plating process, CVD, ALD, PVD, the like, or a combination thereof. In an embodiment, the conductive material of the bond pad 134 is copper, tungsten, aluminum, silver, gold, the like, or a combination thereof.

In an embodiment, the bond pad 134 is an under bump metallization (UBM) 134 and includes three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 134. Any suitable materials or layers of material that may be used for the UBM 134 are fully intended to be included within the scope of the current application.

The semiconductor die 150 includes device pads 124 and at least one bond pad 132 on an active surface of the semiconductor die 150, the active surface being opposite a backside surface of the semiconductor die 150. The semiconductor die 150 (sometimes referred to as a chip 150 or die 150) may be a device die having integrated circuit devices, such as transistors, capacitors, inductors, resistors (not shown), and the like, therein. Further, the semiconductor die 150 may be a logic die having core circuits, and may be, for example, a central processing unit (CPU) die. In some embodiments, the semiconductor die 150 includes multiple stacked dies like a memory stacking.

In some embodiments, the device pads 124 and the bond pad 132 are formed by forming recesses (not shown) into the semiconductor die 150 or a passivation layer (not shown) on the semiconductor die 150. The recesses may be formed to allow the device pads 124 and the bond pad 132 to be embedded into the semiconductor die 150 or the passivation layer. In other embodiments, the recesses are omitted as the device pads 124 and the bond pad 132 may be formed on the active surface of the semiconductor die 150. The device pads 124 electrically couple the subsequently bonded surface mount device 120 to the semiconductor die 150 and the bond pad 132 electrically couples the subsequently bonded semiconductor die 150 to substrate 102 by way of the conductive connector 130. In some embodiments, the device pads 124 and the bond pad 132 include a thin seed layer (not shown) deposited on the semiconductor die 150, such as by PVD, CVD, ALD, the like, or a combination thereof. The seed layer may be made of copper, titanium, nickel, gold, the like, or a combination thereof. The conductive material of the device pads 124 and the bond pad 132 may be deposited over the thin seed layer. The conductive material may be formed by an electro-chemical plating process, CVD, ALD, PVD, the like, or a combination thereof. In an embodiment, the conductive material of the device pads 124 and the bond pad 132 is copper, tungsten, aluminum, silver, gold, the like, or a combination thereof.

In an embodiment, the device pads 124 and the bond pad 132 are UBMs 124 and 132 and include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 124 and 132. Any suitable materials or layers of material that may be used for the UBMs 124 and 132 are fully intended to be included within the scope of the current application.

The surface mount device 120 is mounted to the active surface of the semiconductor die 150 via the conductive connectors 122 and the device pads 124. In an embodiment, the surface mount device 120 has two contacts, which are electrically coupled to the semiconductor die 150 through the conductive connectors 122 and the device pads 124. In some embodiments, the conductive connectors 122 are formed to have height $H_1$ as measured orthogonally from the active surface of the semiconductor die 150 to a surface of the conductive connectors 122. In an embodiment, the height $H_1$ is from about 20 μm to about 30 μm.

The surface mount device 120 may be a passive component such as a capacitor, a resistor, an inductor, the like, or a combination thereof. In an embodiment, the surface mount device 120 consists essentially of one or more passive devices and does not include an active device such as a transistor. In some embodiments, the surface mount device 120 includes one or more active devices such as transistors. As shown in FIG. 1A, the surface mount device 120 may include two conductive connectors 122 formed of conductive materials such as solder, a polymer, the like, or alloys and combinations thereof. In some embodiments, the surface mount device 120 has a height $H_2$ as measured orthogonally from a first surface of the surface mount device 120, the first surface contacting the conductive connectors 122 to a second surface, the second surface being opposite the first surface. In an embodiment, the height $H_2$ can be up to 150 μm.

The conductive connectors 122 may be formed by a metal-paste printing process that is applied to the device pads 124 on the active surface of the semiconductor die 150. According to the locations of the device pads 124, a stencil may be employed to print the metal paste on top of the device pads 124 on the semiconductor die 150. A reflow process is applied to the semiconductor device so that the metal paste may coalesce into conductive connectors 122 on top of the device pads 124 of the semiconductor die 150.

Alternatively, the conductive connectors 122 may be formed by disposing a photo resist (not shown) over the semiconductor die 150, patterning the photo resist to form a plurality of openings over the device pads 124 of the semiconductor die 150, filling the openings with suitable materials such as solder and the like, reflowing the solder materials, and removing the photo resist to expose the conductive connectors 122.

In some embodiments, the conductive connectors 122 are formed on the surface mount device 120 rather than being formed on the semiconductor die 150.

After the conductive connectors 122 are formed, the surface mount device 120 may be placed on the semiconductor die 150 by, for example, a pick and place tool. In an embodiment, the surface mount device 120 is bonded to the semiconductor die 150 by a reflow process. During this reflow process, the device pads 124 on the semiconductor die 150 are in contact with the conductive connectors 122 to physically and electrically couple the surface mount device 120 to the semiconductor die 150.

The solder resist coating 110 may be formed over portions of the first side of the substrate 102 prior to the conductive connector 130 being formed over the contact pad 134. In an embodiment, the solder resist coating 110 is a polymer, an epoxy, the like, or a combination thereof. In some embodiments, the solder resist coating 110 is formed to a thickness from about 10 µm to about 40 µm. As shown in FIG. 1A, the solder resist coating 110 is not formed over a first portion of the substrate 102, the first portion being over with the surface mount device 120 after the semiconductor die 150 is bonded to the substrate 102 via the conductive connector 130.

After the surface mount device 120 is mounted on the semiconductor die 150 and after the solder resist coating 110 is formed over the first side of the substrate 102, the active surface of the semiconductor die 150 is bonded to the first side of the substrate 102 by way of the conductive connector 130 and the bond pads 132 and 134.

The conductive connector 130 may be a solder ball, a metal pillar, a controlled collapse chip connection (C4) bump, a micro bump, an electroless nickel-electroless palladium-immersion gold technique (ENEPIG) formed bump, or the like. The conductive connector 130 may include a conductive material such as solder, copper, aluminum, gold, nickel, silver, palladium, tin, the like, or a combination thereof. In an embodiment in which the conductive connector 130 is a solder bump, the conductive connector 130 is formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shape. In another embodiment, the conductive connector 130 is a metal pillar (such as a copper pillar) formed by a sputtering, printing, electro plating, electroless plating, CVD, or the like. The metal pillar may be solder free and have substantially vertical sidewalls. In some embodiments, a metal cap layer (not shown) is formed on the top of the metal pillar connector 130. The metal cap layer may include nickel, tin, tin-lead, gold, silver, palladium, indium, nickel-palladium-gold, nickel-gold, the like, or a combination thereof and may be formed by a plating process.

The bonding between the semiconductor die 150 and the substrate 102 may be a solder bonding or a direct metal-to-metal (such as a copper-to-copper or tin-to-tin) bonding. In an embodiment, the semiconductor die 150 is bonded to the substrate 102 by a reflow process. During this reflow process, the conductive connector 130 is in contact with the bond pads 132 and 134 to physically and electrically couple the semiconductor die 150 to the substrate 102.

After the semiconductor die 150 is bonded to the substrate 102, the semiconductor device 100 has a standoff height $H_3$ between a surface of the solder resist coating 110 and the active surface of the semiconductor die 150. In an embodiment, the standoff height $H_3$ is from about 140 µm to about 170 µm.

As illustrated in FIGS. 1A and 1B, sidewalls of the surface mount device 120 and sidewalls of the solder resist coating 110 are separated by a distance $D_1$. In an embodiment, the distance $D_1$ is greater than or equal to about 10 µm to ensure sufficient space for the surface mount device 120 in the bonded semiconductor device 100. For example, in a specific embodiment, the height $H_2$ of the surface mount device is about 150 µm, and the height $H_1$ of the conductive connectors 122 is about 25 µm, the standoff height $H_3$ of the semiconductor device 100 is about 155 µm, and the thickness of the solder resist coating 110 is about 30 µm. In this embodiment, the sum of the heights $H_1$ and $H_2$ are 175 µm (25 µm+150 µm) but the standoff height $H_3$ is only 155 µm. However, in this embodiment, by removing the solder resist coating 110 over the surface mount device 120, the surface mount device 120 is afforded about 30 µm more space (i.e. the thickness of the solder resist coating 110) and will fit between the semiconductor die 150 and the substrate 102. Hence, in this embodiment, without removing the solder resist coating 110 over the surface mount device 120, the surface mount device 120 would not fit between the semiconductor die 150 and the substrate 102 and the surface mount device 120 could be damaged, could cause a defective bond between the bond pads 132 and 134 and the conductive connector 130, or other various defects and/or issues.

As illustrated in FIG. 1B, the removed portion of the solder resist coating 110 is a similar shape to the shape of the surface mount device 120 in the plan view. However, in other embodiments, the removed portion of the solder resist coating 110 is different shape than the surface mount device 120. For example, the removed portion of the solder resist coating 110 may be circular in the plan view while the surface mount device 120 is substantially square or rectangular in the plan view.

An underfill material (not shown) may be injected or otherwise formed in the space between the semiconductor die 150 and the substrate 102 and surrounding the surface mount device 120 and the conductive connector 130. The underfill material may, for example, be a liquid epoxy, deformable gel, silicon rubber, or the like, that is dispensed between the semiconductor die 150 and the substrate 102, and then cured to harden. This underfill material is used, among other things, to reduce damage to and to protect the surface mount device 120 and the connector 130.

It should be noted that the number of semiconductor dies (e.g., semiconductor die 150), surface-mount devices (e.g., surface mount device 120), and conductive connectors (e.g. conductive connectors 130 and 122) shown in FIGS. 1A and 1B are merely an example. There may be many variations, modifications, and alternatives. For example, a person skilled in the art will recognize that the semiconductor device 100 may accommodate any number of semiconductor dies, surface-mount devices, and conductive connectors.

By having the surface mount device embedded between the semiconductor die and the substrate, the form factor of the semiconductor device can be lowered as compared to a device where the surface mount device is mounted on the substrate adjacent the semiconductor die or somewhere else on the semiconductor device. In addition, the signal integrity for the surface mount device will be improved, as there is no need of a long metal conductor, such as a redistribution line or interconnect, to couple the semiconductor die to the surface mount device. Further, no extra processing steps or costs are incurred as the portion of the solder resist coating over the surface mount device can formed and patterned in the same processes as it formed and patterned for the conductive connectors.

Figure 2A:
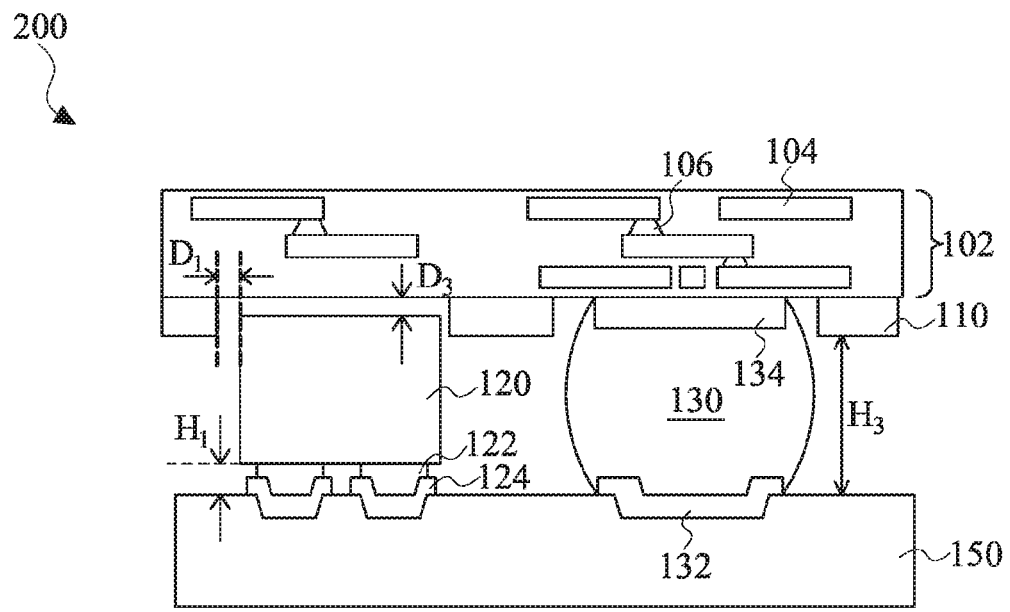
FIGS. 2A and 2B illustrate a cross-sectional view and a plan view, respectively, of a semiconductor device in accordance with some embodiments.
Figure 2B:
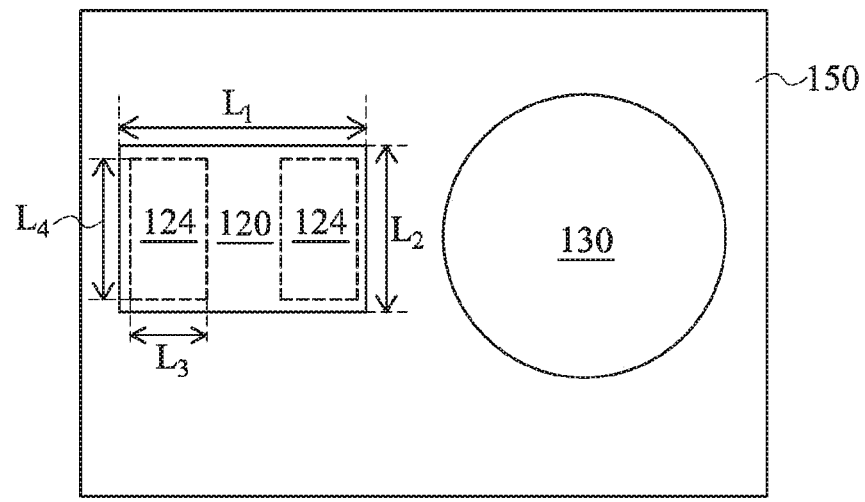

FIGS. 2A and 2B illustrate a cross-sectional view and a plan view, respectively, of a semiconductor device 200 in accordance with some embodiments. In this embodiment, the height $H_1$ of the conductive connectors 122 may be further controlled by ensuring that the device pads 124 have at least at least a minimum area in a plane parallel to the active surface of the semiconductor die 150 relative to the total area of the surface mount device 120 in the same plane. Further, in this embodiment, the surface of the surface mount device 120 nearest the substrate 102 is separated from the surface of the substrate 102 by a distance $D_3$. In some embodiments, the distance $D_3$ is at least 10 µm. Details regarding this embodiment that are similar to those for the previously described embodiment will not be repeated herein.

The surface mount device 120 has a length $L_1$ along a first side and a length $L_2$ along a second side, the first side being substantially perpendicular to the first side. In some embodiments, the length $L_1$ is from about 300 µm to about 2000 µm and the length $L_2$ is from about 300 µm to about 2000 µm. Each of the device pads 124 have a length $L_3$ along a first side and a length $L_4$ along a second side, the second side being perpendicular to the first side. In an embodiment, the total area of all of the device pads 124 (e.g. number of device pads×($L_3$×$L_4$)) in a plane parallel to the active surface of the semiconductor die 150 is at least one tenth of the total area of the surface mount device 120 (e.g. $L_1$×$L_2$) in the same plane. In an embodiment with two device pads 124, the area of each of the device pads 124 (e.g. $L_3$×$L_4$) in a plane parallel to the active surface of the semiconductor die 150 is at least one twentieth of the total area of the surface mount device 120 (e.g. $L_1$×$L_2$) in the same plane.

By ensuring that the device pads for the surface mount device are of a minimum area, the total height of the conductive connectors formed over the device pads can be further controlled.

Figure 3:
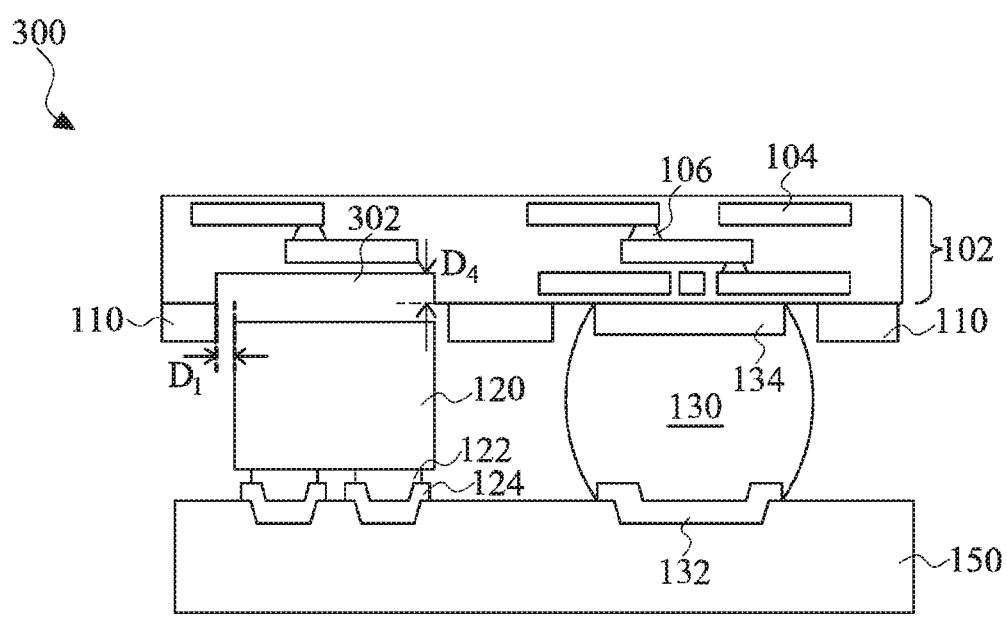
FIG. 3 illustrates a cross-sectional view of a semiconductor device in accordance with some embodiments.

FIG. 3 illustrates a cross-sectional view of a semiconductor device 300 in accordance with some embodiments. In this embodiment, in addition to the solder resist coating 110 being removed over the surface mount device 120, the substrate 102 is recessed a distance $D_4$ over the surface mount device 120. Details regarding this embodiment that are similar to those for the previously described embodiments will not be repeated herein.

Before the semiconductor die 150 is bonded to the substrate 102, a recess 302 is formed in a first portion of the first side of the substrate 102, the first portion of the substrate 102 being over the surface mount device 120 when the surface mount device 120 is bonded to the substrate 102 in the semiconductor device 300. In an embodiment, the distance $D_4$ from the first side of the substrate 102 to the surface in the recess 302 is greater than about 10 µm. The recess 302 may be formed by a suitable process, such as an etching process, a laser, the like, or a combination thereof. The metallization layers 104 in the substrate 102 may be designed such that the recess 302 does not interfere with any of the metallization layers 104 as illustrated in FIG. 3. In some embodiments, the sidewalls of the recess 302 are substantially aligned with the sidewalls of the solder resist coating 110.

By forming a recess in the substrate over the surface mount device, the process window for the surface mount device is increased as a surface mount device with a greater height may fit between the substrate and the semiconductor die.

Figure 4A:
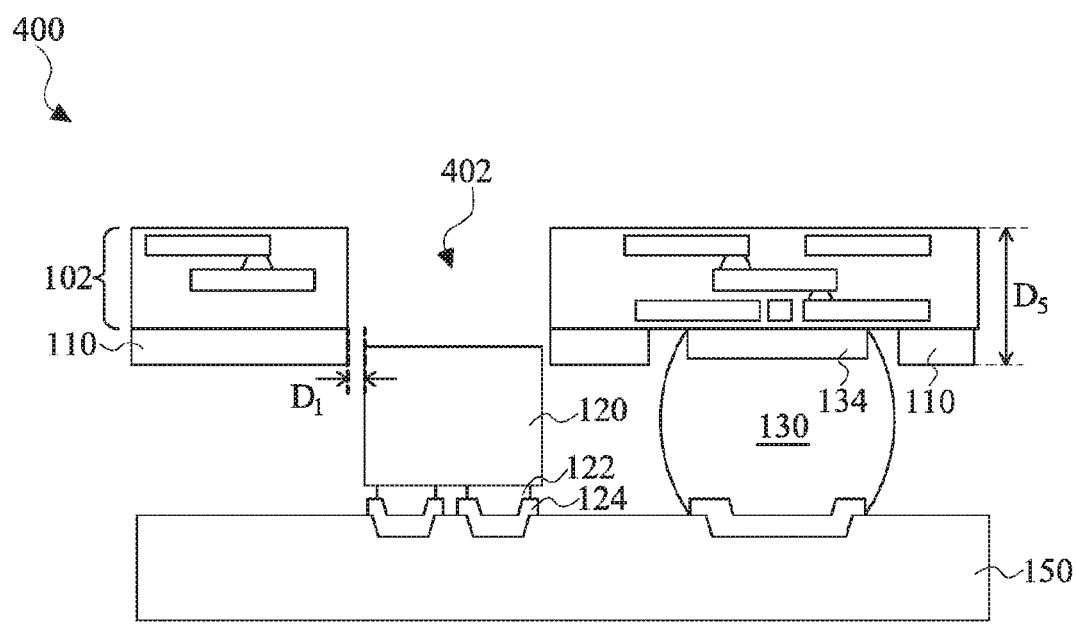
FIGS. 4A and 4B illustrate a cross-sectional view and a plan view, respectively, of a semiconductor device in accordance with some embodiments.
Figure 4B:
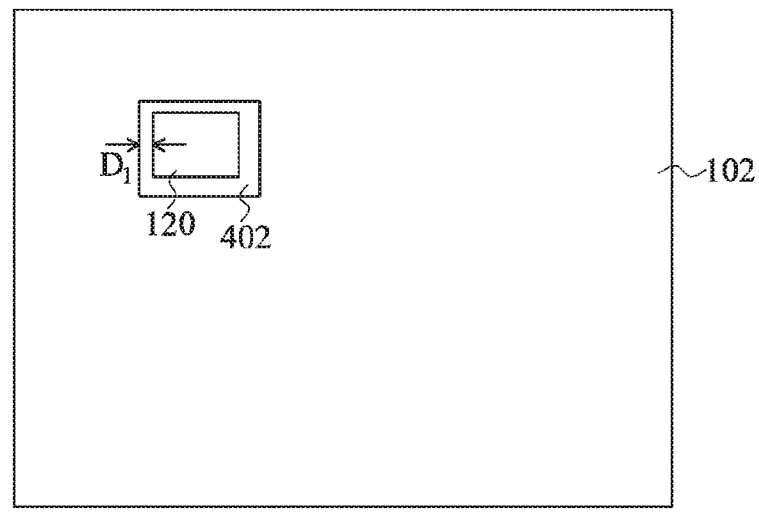

FIGS. 4A and 4B illustrate a cross-sectional view and a plan view, respectively, of a semiconductor device 400 in accordance with some embodiments. In this embodiment, the substrate 102 has an opening 402 extending through the substrate 102 over the surface mount device 120. Details regarding this embodiment that are similar to those for the previously described embodiments will not be repeated herein.

Before the semiconductor die 150 is bonded to the substrate 102, the opening 402 is formed in the first portion of the substrate 102, the first portion of the substrate 102 being over the surface mount device 120 when the surface mount device 120 is bonded to the substrate 102 in the semiconductor device 400. The opening 402 may be formed by a suitable process, such as an etching process, a laser, the like, or a combination thereof. The metallization layers 104 in the substrate 102 may be designed such that the opening 402 does not interfere with any of the metallization layers 104 as illustrated in FIG. 4A. In some embodiments, the sidewalls of the opening 402 are substantially aligned with the sidewalls of the solder resist coating 110.

By forming an opening through the substrate over the surface mount device, the process window for the surface mount device is increased as a surface mount device with a greater height may fit between the substrate and the semiconductor die.

A semiconductor device having a surface mount device embedded between a semiconductor die and a substrate may provide advantages such as, the form factor of the semiconductor device being lowered as compared to a device where the surface mount device is mounted on the substrate adjacent the semiconductor die or somewhere else on the semiconductor device. In addition, the signal integrity for the surface mount device will be improved, as there is no need of a long metal conductor, such as a redistribution line or interconnect, to couple the semiconductor die to the surface mount device. Further, no extra processing steps or costs are incurred as the portion of the solder resist coating over the surface mount device can formed and patterned in the same processes as it formed and patterned for the conductive connectors.

An embodiment is a device including a solder resist coating over a first side of a substrate, an active surface of a die bonded to the first side of the substrate by a first connector, and a surface mount device mounted to the die by a second set of connectors, the surface mount device being between the die and the first side of the substrate, the surface mount device being spaced from the solder resist coating.

Another embodiment is a device including a solder resist coating on a first side of a printed circuit board (PCB), a first conductive connector coupled to the first side of the PCB, and a semiconductor die bonded to the PCB by the first conductive connector. The device further includes a surface mount device coupled to the semiconductor die, the surface mount device being between the semiconductor die and the PCB, a first portion of the first side of the PCB being exposed over the surface mount device.

A further embodiment is a method of forming a device, the method including forming a solder resist coating over a first side of a substrate, a first portion of the first side of the substrate being exposed between portions of the solder resist coating, mounting a surface mount device to an active surface of a semiconductor die, and mounting the active surface of the semiconductor die to the first side of the substrate using a first conductive connector, the first portion of the first side of the substrate being over the surface mount device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a polymer layer over a first side of a substrate, at least a portion of the polymer layer being removed over a first portion of the first side of the substrate;
    a die bonded to the first side of the substrate by a first connector; and
    a surface mount device mounted to the die, the surface mount device being between the die and the first side of the substrate, the first portion of the first side of the substrate being over the surface mount device.

2. The device of claim 1, wherein an active surface of the die is bonded to the first side of the substrate by the first connector.

3. The device of claim 1 further comprising a recess in the first portion of the first side of the substrate.

4. The device of claim 3, wherein sidewalls of the recess and sidewalls of the polymer layer are substantially aligned.

5. The device of claim 1, wherein a sidewall of the surface mount device is separated from a sidewall of the polymer layer by at least 10 µm.

6. The device of claim 1, wherein the surface mount device mounted to the die by a second set of connectors.

7. The device of claim 6, wherein a sum of a height of the surface mount device and the second set of connectors as measured from an active surface of the die to a first surface of the surface mount device is greater than a standoff height from the active surface of the die to a first surface of the polymer layer, the first surface of the polymer layer being distal the first side of the substrate.

8. The device of claim 1 further comprising an opening extending through the substrate, the opening being over the surface mount device.

9. A structure comprising:
    a die having an active surface bonded to a first side of a substrate by a first set of connectors;
    a surface mount device bonded to the active surface of the die by a second set of connectors, the surface mount device being between the die and the substrate; and
    a polymer layer on the first side of the substrate, the polymer layer surrounding a first portion of the surface mount device, the first portion of the surface mount device being proximate the first side of the substrate.

10. The structure of claim 9 further comprising:
    an underfill material between the die and the first side of the substrate, the underfill material surrounding the surface mount device and the first set of connectors.

11. The structure of claim 9, wherein sidewalls of the polymer layer are spaced from sidewalls of the first portion of the surface mount device by a first spacing.

12. The structure of claim 9 further comprising an opening extending through the substrate, the opening being over the surface mount device.

13. The structure of claim 9 further comprising a recess in the first side of the substrate over the surface mount device.

14. The structure of claim 13, wherein sidewalls of the recess and sidewalls of the polymer layer are substantially aligned.

15. The structure of claim 9, wherein a sum of a height of the surface mount device and the second set of connectors as measured from an active surface of the die to a first surface of the surface mount device is greater than a standoff height from the active surface of the die to a first surface of the polymer layer, the first surface of the polymer layer being distal the first side of the substrate.

16. A method comprising:
    bonding an active surface of a die to a first side of a substrate using a first conductive connector, a surface mount device being bonded to the active surface of the die, a polymer layer being over a first side of the substrate, the polymer layer surrounding a first portion of the surface mount device, the first portion of the surface mount device being proximate the first side of the substrate.

17. The method of claim 16, wherein a sidewall of the surface mount device is separated from a sidewall of the polymer layer by a first spacing.

18. The method of claim 16 further comprising recessing the first portion of the first side of the substrate.

19. The method of claim 18, wherein the surface mount device partially extends into the recess in the first portion of the first side of the substrate.

20. The method of claim 16 further comprising forming an opening through the substrate, the opening being aligned with the first portion of the first side of the substrate.

* * * * *